United States Patent
Nguyen

(10) Patent No.: US 9,467,136 B1
(45) Date of Patent: Oct. 11, 2016

(54) MONOLITHIC INTEGRATED CIRCUIT SWITCH DEVICE WITH OUTPUT CURRENT BALANCING FOR PARALLEL-CONNECTION

(71) Applicant: Monolithic Power Systems, Inc., San Jose, CA (US)

(72) Inventor: James Nguyen, San Jose, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 0 days.

(21) Appl. No.: 14/961,659

(22) Filed: Dec. 7, 2015

Related U.S. Application Data

(60) Provisional application No. 62/237,456, filed on Oct. 5, 2015.

(51) Int. Cl.
| | | |
|---|---|---|
| *H03B 1/00* | (2006.01) | |
| *H03K 3/00* | (2006.01) | |
| *H03K 17/06* | (2006.01) | |
| *H03K 17/687* | (2006.01) | |

(52) U.S. Cl.
CPC .......... *H03K 17/063* (2013.01); *H03K 17/687* (2013.01)

(58) Field of Classification Search
USPC ................................................ 327/108–112
See application file for complete search history.

(56) References Cited

U.S. PATENT DOCUMENTS

| | | | | |
|---|---|---|---|---|
| 6,525,602 B1 * | 2/2003 | Tomasini | .............. | H03F 3/3028 327/108 |
| 7,133,601 B2 * | 11/2006 | Phillips | .................... | H02P 29/02 318/599 |
| 7,339,772 B2 | 3/2008 | Ochi | | |
| 7,384,276 B2 | 6/2008 | Lee | | |
| 7,821,753 B2 | 10/2010 | Evans et al. | | |
| 7,949,814 B2 * | 5/2011 | Chan | ................... | G06F 13/4081 710/302 |
| 8,493,734 B2 | 7/2013 | Chien et al. | | |
| 8,645,753 B2 | 2/2014 | Yang et al. | | |
| 8,694,806 B2 * | 4/2014 | Schindler | ................ | G06F 1/266 307/31 |
| 8,829,884 B2 * | 9/2014 | Zhong | ........................ | G05F 3/26 315/294 |
| 8,963,617 B1 * | 2/2015 | Sim | ........................ | H03K 17/687 327/427 |
| 2006/0209875 A1 * | 9/2006 | Lum | ........................ | H04L 12/10 370/445 |
| 2007/0263675 A1 * | 11/2007 | Lum | ........................ | H04L 12/10 713/300 |

(Continued)

OTHER PUBLICATIONS

MAX15090/MAX15090A 2.7V to 18V, 12A, Hot-Swap Solution with Current Report Output, Rev.2, Sep. 2013, pp. 1-15, maxim integrated.

*Primary Examiner* — Adam Houston
(74) *Attorney, Agent, or Firm* — Okamoto & Benedicto LLP

(57) ABSTRACT

An electrical circuit includes monolithic integrated circuit (IC) switch devices that are connected in parallel. A monolithic IC switch device includes a first pin, a second pin, and a power switch that connects the first pin to the second pin through the power switch when the electrical circuit is turned ON. The monolithic IC switch device includes a current balancing circuit that controls the power switch to reduce an output current of the monolithic IC switch device when the output current of the monolithic IC switch device increases above the average of the output currents of monolithic IC switch devices in the electrical circuit.

20 Claims, 18 Drawing Sheets

(56) References Cited

U.S. PATENT DOCUMENTS

| | | | | |
|---|---|---|---|---|
| 2010/0013305 A1* | 1/2010 | Heineman | H02J 1/102 | 307/31 |
| 2010/0013306 A1* | 1/2010 | Heineman | H02J 1/08 | 307/32 |
| 2010/0013307 A1* | 1/2010 | Heineman | G06F 1/26 | 307/33 |
| 2010/0079175 A1* | 4/2010 | Qiu | H02M 3/1584 | 327/108 |
| 2010/0109537 A1* | 5/2010 | Nishino | H05B 33/0827 | 315/185 R |
| 2012/0098577 A1* | 4/2012 | Lobsiger | H02M 1/088 | 327/109 |
| 2016/0182039 A1* | 6/2016 | Xiao | H03K 17/18 | 307/115 |

* cited by examiner

MONOLITHIC INTEGRATED CIRCUIT SWITCH DEVICE WITH OUTPUT CURRENT BALANCING FOR PARALLEL-CONNECTION

CROSS-REFERENCE TO RELATED APPLICATION

This application claims the benefit of U.S. Provisional Application No. 62/237,456, filed on Oct. 5, 2015, which is incorporated herein by reference in its entirety.

BACKGROUND OF THE INVENTION

1. Field of the Invention

The present invention relates generally to integrated circuits, and more particularly but not exclusively to switches for electronic devices.

2. Description of the Background Art

Switches are employed in electronic devices to connect and disconnect an input power supply to a load. These switches are typically employed in removable circuit cards (e.g., add-on boards), hot-swap storage devices, and other applications involving connection of an input power supply to a load. A typical switch in such applications has a terminal connected to the input power supply and an opposing terminal connected to the load. As a particular example, the switch can be used to allow a hot-swap disk drive (the load in this example) to receive power from a power supply by way of a disk drive bay or motherboard. The switch can be implemented using a power transistor. The gate of the power transistor can be tied to a capacitor, which charges during startup. Once fully charged, the capacitor keeps the power transistor ON to allow the load to continuously receive the power supply voltage.

SUMMARY

In one embodiment, an electrical circuit includes monolithic integrated circuit (IC) switch devices that are connected in parallel. A monolithic IC switch device includes a first pin, a second pin, and a power switch that connects the first pin to the second pin through the power switch when the electrical circuit is turned ON. The monolithic IC switch device includes a current balancing circuit that controls the power switch to reduce an output current of the monolithic IC switch device when the output current of the monolithic IC switch device increases above the average of the output currents of monolithic IC switch devices in the electrical circuit.

These and other features of the present invention will be readily apparent to persons of ordinary skill in the art upon reading the entirety of this disclosure, which includes the accompanying drawings and claims.

The use of the same reference label in different drawings indicates the same or like components.

DETAILED DESCRIPTION

In the present disclosure, numerous specific details are provided, such as examples of electrical circuits, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
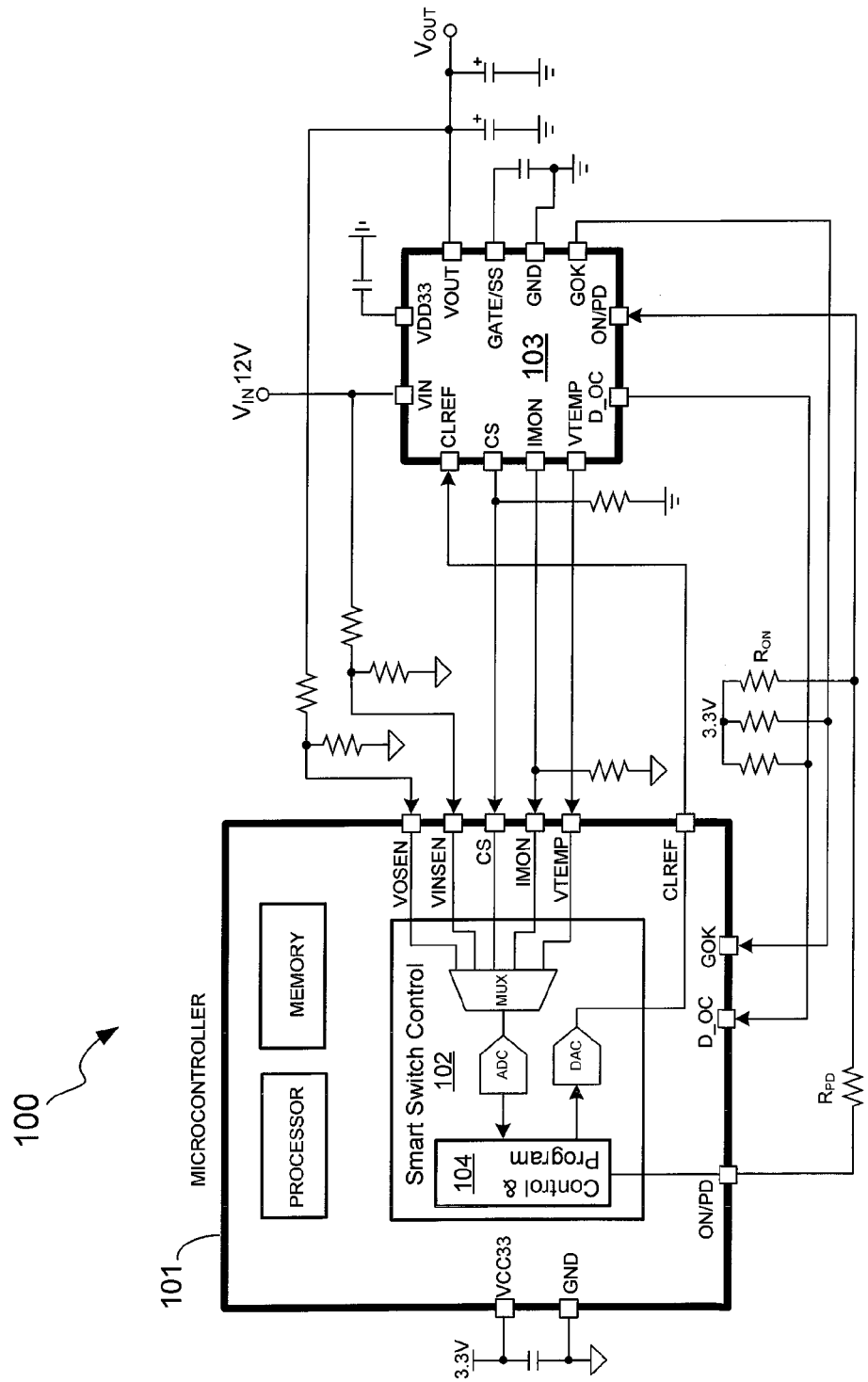
FIG. 1 shows a schematic diagram of a system for connecting an input power supply to a load in accordance with an embodiment of the present invention.

FIG. 1 shows a schematic diagram of a system 100 for connecting an input power supply to a load in accordance with an embodiment of the present invention. In the example of FIG. 1, the system 100 comprises a single-chip microcontroller 101 and a monolithic integrated circuit (IC) switch device 103. The switch device 103 is a "smart switch" in that it is controllable by a microcontroller and has integrated driving circuits for driving a power transistor and integrated monitoring circuits for providing switch and power supply conditions to the microcontroller.

In one embodiment, the switch device 103 is a monolithic IC in that it is a single-die chip. In the example of FIG. 1, the switch device 103 has a plurality of pins that includes a VIN pin for accepting an input power supply voltage $V_{IN}$ and a VOUT pin that is connected to a load. The switch device 103 can include a power switch (see FIG. 2, 201), such as a power field effect transistor (FET). The power switch can have a first terminal (e.g., drain) connected to the VIN pin and a second terminal (e.g., source) connected to the VOUT pin. The switch device 103 includes circuitry that drives the gate of the power switch for turning the power switch ON and OFF in a controlled manner. When turned ON, the power switch connects the input power supply that is connected to the VIN pin to the load that is connected to the VOUT pin. In the example of FIG. 1, the input power supply generates 12V at 60 A for illustration purposes. As can be appreciated, the system 100 can also be employed to connect other input power supplies with different voltage and current ratings to a load.

In the example of FIG. 1, the switch device 103 further includes a GOK pin for indicating a fault (e.g., over temperature, short circuit, power switch short fault), a GND pin for connecting the switch device 103 to signal ground, an ON/PD pin for enabling/disabling the switch device 103 or for placing the switch device 103 in pull-down mode, a D_OC pin for providing a digital over current indicator signal, a VTEMP pin for indicating the junction temperature (i.e., die temperature of the monolithic IC) of the switch device 103, an IMON pin for indicating the amount of output current of the switch device 103 (i.e., DC current flowing out from the VOUT pin), a current sense (CS) pin for providing another indicator of an amount of the output current of the switch device 103, a CLREF pin for receiving a current limit reference signal, a GATE or SS pin that accepts a capacitor for controlling the ramp rate of the turn ON of the power switch, and a VDD33 pin for outputting an internal (i.e., within the monolithic IC switch device 103) load dropout regulator (LDO) output voltage.

In the example of FIG. 1, the microcontroller 101 includes a smart switch control circuit 102 comprising a multiplexer (MUX), an analog to digital converter (ADC), a digital to analog converter (DAC), and a control and program logic 104 (e.g., firmware, programmable logic). The microcontroller 101 can enable or disable the switch device 103 based on conditions of the switch device 103. The microcontroller 101 can receive condition indicator signals (e.g., temperature, current sense, current monitor, fault) from the switch device 103. The microcontroller 101 can be any suitable generic microprocessor or other single-chip processor with integrated analog and digital input/output pins, configurable firmware, and/or data acquisition and processing features. The microcontroller 101 is "generic" in that it is not specially designed to work with the switch device 103 and includes generic microcontroller/microprocessor components, such as a processor and memory. Advantageously, the switch device 103 can be controlled by a generic microcontroller without necessarily requiring a specially designed, dedicated external controller to interface the switch device 103 to the microcontroller. The switch device 103 can be directly controlled by the microcontroller 101.

In the example of FIG. 1, the microcontroller 101 receives indicator signals from the switch device 103 and controls the operation of the switch device 103 based on the indicator signals. More particularly, the CS, IMON, VTEMP, D_OC, and GOK pins of the switch device 103 can be connected to the microcontroller 101 to allow the microcontroller 101 to receive and process indicator signals from the aforementioned pins. For example, the microcontroller 101 can receive an indicator signal (e.g., junction temperature indicator) from a pin (e.g., VTEMP pin) of the switch device 103, direct the indicator signal to the analog to digital converter for analog-to-digital conversion, and provide the digital equivalent of the indicator signal to the control and program logic 104 for processing. The microcontroller 101 can also be connected to detect the input power supply voltage $V_{IN}$ and the output power supply voltage $V_{OUT}$ in a similar manner. More particularly, the microcontroller 101 can sense the input power supply voltage $V_{IN}$ at the VINSEN pin and sense the output power supply voltage $V_{OUT}$ at the VOSEN pin. The microcontroller 101 can direct the sensed input power supply voltage $V_{IN}$ or the sensed output power supply voltage $V_{OUT}$ to the control and program logic 104 through the path comprising the MUX and ADC of the smart switch control circuit 102.

In the example of FIG. 1, the GOK and D_OC pins of the switch device 103 can output digital indicator signals that can be received by the microcontroller 101 through a digital input pin for processing by the control and program logic 104. In one embodiment, the signals output by the GOK and D_OC pins of the switch device 103 are digital, and thus can be processed by the control and program logic 104 without analog-to-digital conversion.

In the example of FIG. 1, the microcontroller 101 has a GOK pin that is coupled to the GOK pin of the switch device 103. A fault indicator signal from the GOK pin of the switch device 103 indicates whether the switch device 103 is operating properly or has a fault condition. The microcontroller 101 receives and processes the fault indicator signal from the GOK pin of the switch device 103 to control the switch device 103. For example, the microcontroller 101 can place the switch device 103 in pull down mode or disable the switch device 103 when the fault indicator signal indicates that there is something wrong with the switch device 103.

In the example of FIG. 1, the microcontroller 101 has an ON/PD pin that is coupled to the ON/PD pin of the switch device 103. The microcontroller 101 can enable the switch device 103 by sending an enable signal to the ON/PD pin of the switch device 103. In one embodiment, the switch device 103 is enabled, i.e., operable to connect the input power supply to the load, when the enable signal is asserted on the ON/PD pin of the switch device 103. The switch device 103 is disabled, i.e., disconnects the input power supply from the load, when the enable signal is not asserted. In one embodiment, the switch device 103 reverts to pull-down (PD) mode in which the switch device 103 pulls down the VOUT pin when the enable signal is held at a predetermined level for a predetermined amount of time.

In the example of FIG. 1, the control and program logic 104 can be configured to retrieve or determine a soft start current limit value. The control and program logic 104 can also change the current limit value at anytime of the operation based on sensed input power supply voltage $V_{IN}$ and output power supply voltage $V_{OUT}$ and/or based on system load conditioning requirements. The current limit value can be converted by the digital-to-analog converter of the smart switch control circuit 102 to a current limit reference signal in analog form, or be converted to a digital coding output, which will then be converted to an analog form by discrete components. The microcontroller 101 outputs the current limit reference signal (in analog or digital form) at its CLREF pin; the switch device 103 receives the current limit reference signal at its corresponding CLREF pin.

In the example of FIG. 1, the microcontroller 101 receives two supply current indicator signals from the switch device 103. The first supply current indicator signal is a current sense signal that is output by the switch device 103 on the CS pin. In one embodiment, the current sense signal is a current that is proportional to the output current. The current sense signal can be used for current balancing and over current protection. The second supply current indicator signal is a current monitor signal that is output by the switch device 103 on the IMON pin. In one embodiment, the current monitor signal is a voltage that is linearly proportional to the output current and is relatively small in magnitude (e.g., 0 to 1.6V). This makes the current monitor signal especially useful in allowing the microcontroller 101 to accurately detect the amount of current flowing through the power switch of the switch device 103.

For various reasons including safety, trouble shooting, load balancing, etc., it is advantageous to know the junction temperature of the switch device 103. Accordingly, in the example of FIG. 1, the microcontroller receives a temperature indicator signal indicating the junction temperature of the switch device 103. In one embodiment, the temperature indicator signal from the VTEMP pin of the switch device 103 is a voltage that is proportional to the junction temperature (e.g., 10 mV/° C.). The program and control logic 104 can take into account the junction temperature in deciding whether to disable the switch device 103, trigger an alarm, or report a fault condition, for example.

Figure 2:
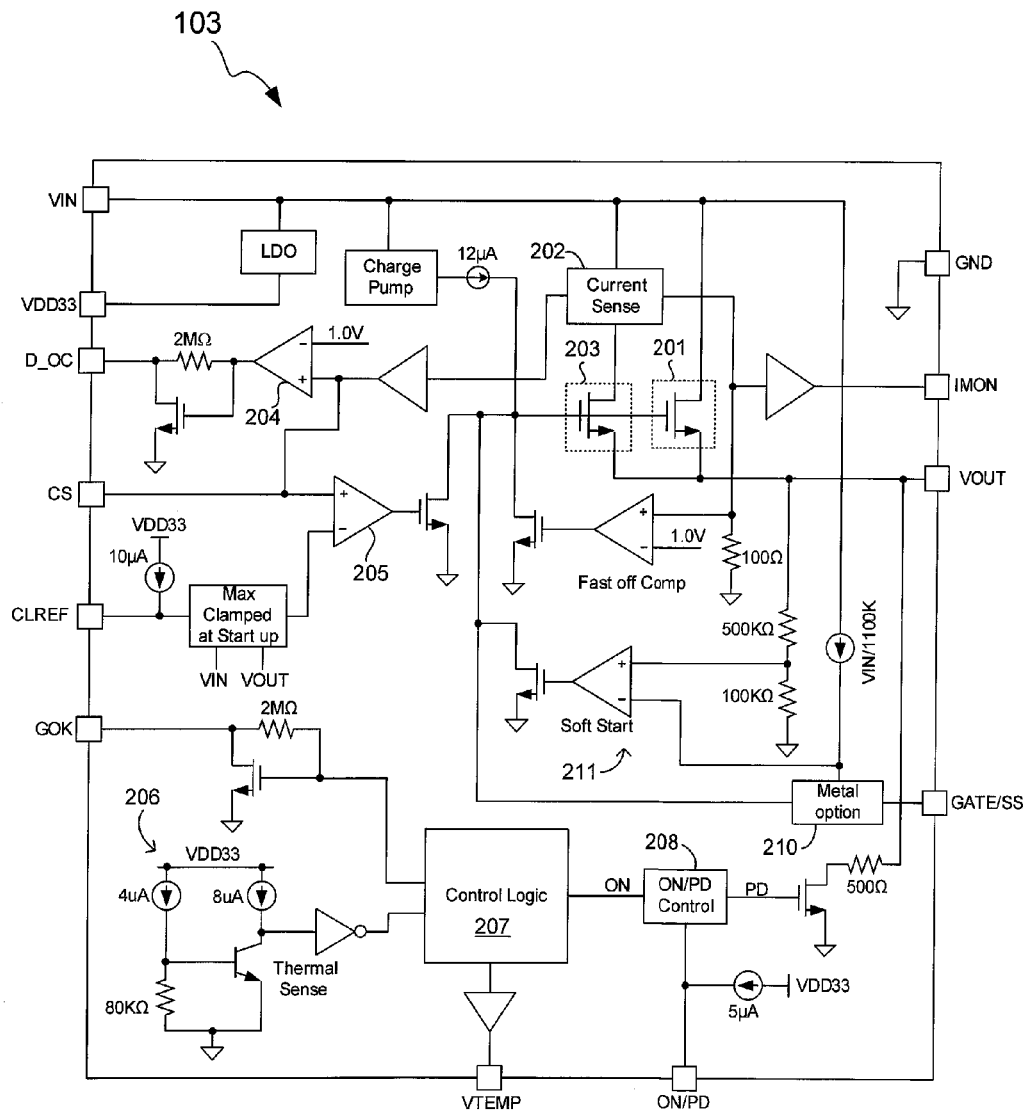
FIG. 2 shows a schematic diagram of a monolithic integrated circuit (IC) switch device in accordance with an embodiment of the present invention.

FIG. 2 shows a schematic diagram of a monolithic IC switch device 103 in accordance with an embodiment of the present invention. In the example of FIG. 2, the power switch 201 of the switch device 103 is a power field effect transistor (FET). A current sense circuit 202 senses the current flowing from the VIN pin to the VOUT pin. The current sense circuit 202 outputs a corresponding current sense signal at the CS pin and a corresponding current monitor signal at the IMON pin. A transistor 203 (e.g., a FET), which can be sized much smaller than the power switch 201 (e.g., 1/10000 in size), is in parallel with the power switch 201 for current sensing. The current sense signal voltage is compared to a threshold voltage by the comparator 204 to detect an overcurrent, which is a condition indicated on the D_OC pin as a digital overcurrent indicator. The switch device 103 receives a current limit reference signal voltage at its CLREF pin, which is compared by the amplifier 205 to the current sense signal voltage to control the gate of the power switch 201 and thereby limit in-rush current during startup, such in applications where a circuit card is inserted into a live (i.e., powered up) backplane. Similarly, the output of amplifier 205 can control the gate of the power switch 201 to limit load current that may be drawn from the VIN pin to the VOUT pin during normal operation or power saving mode. In one embodiment, the amplifier 205 is an operational transconductance amplifier (OTA).

In the example of FIG. 2, a low dropout regulator (LDO) receives the input power supply voltage $V_{IN}$ at the VIN pin and generates a supply voltage on the VDD33 pin (e.g., 3.3V output). A thermal sense circuit 206 senses the junction temperature of the switch device 103 for the control logic 207, which outputs a corresponding junction temperature indicator signal at the VTEMP pin. In one embodiment, the control logic 207 implements an over temperature latch that shuts down the switch device 103 when the junction temperature reaches a threshold junction temperature limit (e.g., 145° C.).

In one embodiment, the control logic 207 outputs a fault indicator signal at the GOK pin to indicate a short circuit, power switch 201 short or open, over temperature, or other fault condition. The GOK pin can be an open drain output during normal operation and pulled LOW by the control logic 207 when a fault is detected. An enable signal from the microcontroller 101 can be received on the ON/PD pin of the switch device 103 by an ON/PD control circuit 208, which passes the enable signal to the control logic 207. The control logic 207 turns OFF the power switch 201 to disconnect the input power supply from the load when the enable signal is not asserted. In one embodiment, the ON/PD control circuit 208 pulls down the VOUT pin when the enable signal is held at a predetermined level for a predetermined amount of time.

In the example of FIG. 2, a metal option (see 210) allows the GATE/SS pin to be connected directly to the gate of the power switch 201 or to a soft start circuit 211. When the GATE/SS pin is metal optioned to directly connect to the gate of the power switch 201, a capacitor can be connected to the GATE/SS pin to reduce inrush current during startup. When the GATE/SS pin is metal optioned to connect to the soft start circuit 211, the capacitance of the capacitor connected to the GATE/SS pin determines the soft start time.

Figure 3:
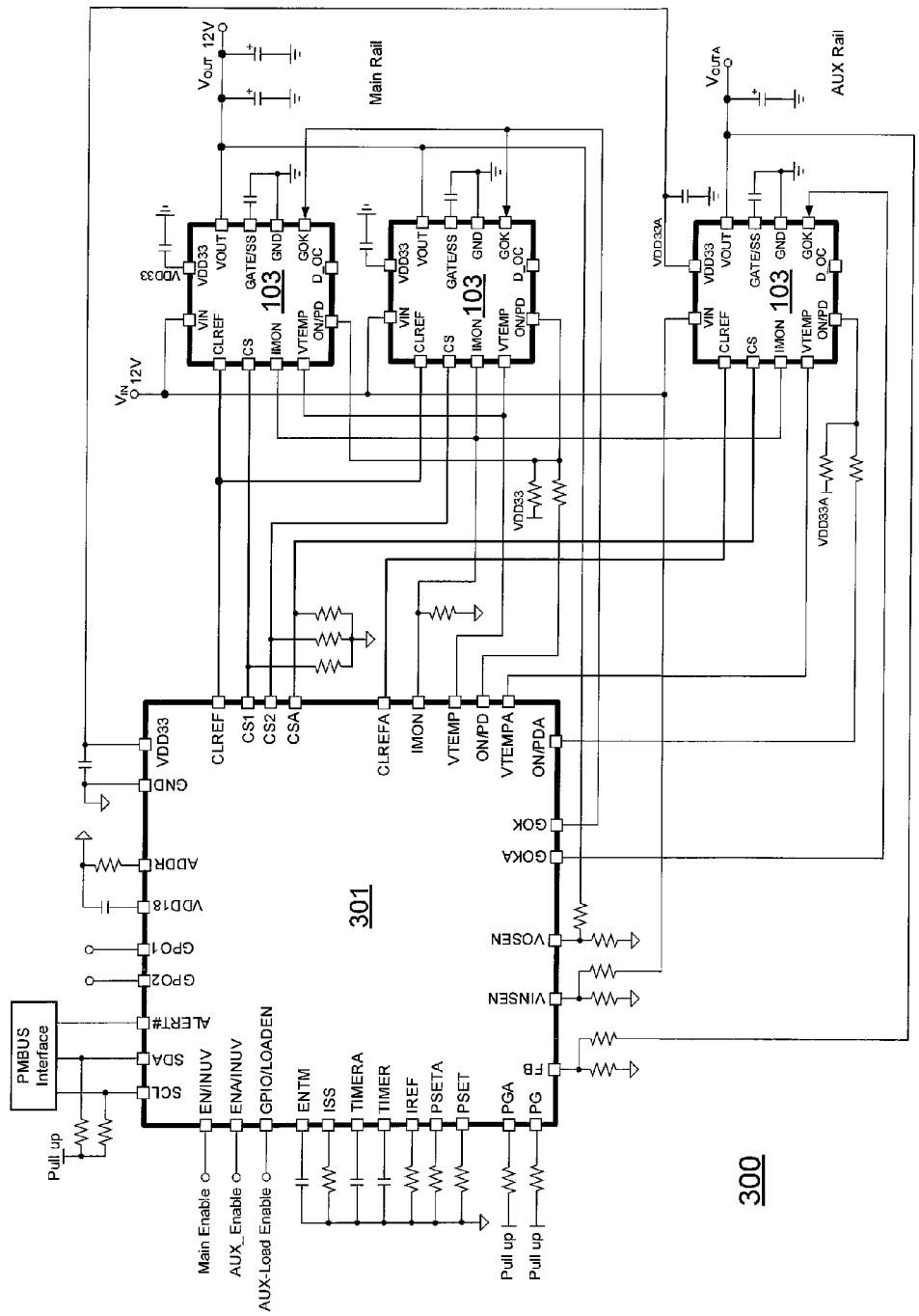
FIG. 3 shows a schematic diagram of a system for connecting an input power supply to one or more loads in accordance with an embodiment of the present invention.

FIG. 3 shows a schematic diagram of a system 300 for connecting an input power supply to one or more loads in accordance with an embodiment of the present invention. In the example of FIG. 3, a single input power supply that provides an input power supply voltage $V_{IN}$ is connected in parallel to a plurality of switch devices 103. Current sense signals from the switch devices 103 are separately received by the microcontroller 301 for individual control and diagnostics.

In the example of FIG. 3, the current monitor signals from the switch devices 103 can be received individually by the microcontroller 301. The current monitor signals can also be tied together or in groups for input to the microcontroller 301. The same can be done for the temperature indicator signals. In the example of FIG. 3, the microcontroller 301 has sufficient integrated digital and analog I/O ports and data acquisition components to accommodate the multiple switch devices 103.

In the example of FIG. 3, two switch devices 103 (top and middle) form a group that receives the input power supply in parallel to provide a combined power supply output (Main Rail) at the tied VOUT pins of the switch devices 103. A separate switch device 103 (bottom) is also in parallel to receive the input power supply, but provides a separate power supply output (AUX rail). This allows for generating two output power supply voltages $V_{OUT}$ and $V_{OUTA}$ from a single input power supply voltage $V_{IN}$.

Providing at least two supply current indicators to a microcontroller is especially advantageous in parallel configurations because each switch device 103 can provide separate current sense signals to the microcontroller for individual current limit programming. In the example of FIG. 3, current sense signals from the CS pins of the switch devices 103 are separately provided to and received by the microcontroller 301. Current monitor signals from IMON pins of two or more switch devices 103 can be combined together to allow the microcontroller 301 to determine the total output current of a group of switch devices 103. This is exemplified in FIG. 3, where the IMON pins of the switch devices 103 are tied together to provide the microcontroller 301 a combined current monitor signal that indicates the total output current; the combined current monitor signal is received in a single IMON pin of the microcontroller 301.

Figure 4:
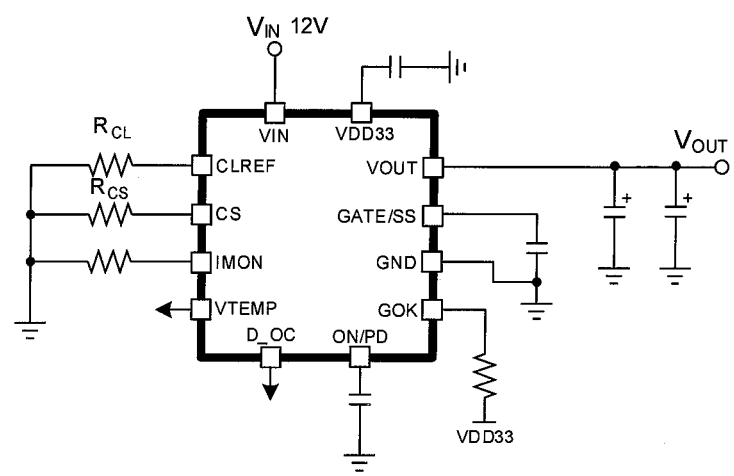
FIG. 4 shows a schematic diagram of a monolithic IC switch device in standalone mode in accordance with an embodiment of the present invention.

FIG. 4 shows a schematic diagram of a switch device 103 in standalone mode (i.e., not controlled by a microcontroller) in accordance with an embodiment of the present invention. In the example of FIG. 4, the GATE/SS pin of the switch device 103 can be tied to a capacitor to control the degree of conduction of the power switch for soft start. The CS pin can be tied to a resistor $R_{CS}$ to program the over current flag (D_OC) current level and the maximum allowable DC output current through the power switch 201 (see FIG. 2). The over current flag reference level is determined by the switch device 103. The maximum allowable current limit reference level can be implemented by connecting a resistor $R_{CL}$ on the CLREF pin. In one embodiment, where an internal 10 µA current source drives the CLREF pin, 10 µA×$R_{CL}$ defines the maximum current limit. For example, in the case where the CLREF voltage is set at 1.4V, when the resistor $R_{CS}$ multiplied by the current sense signal becomes higher than 1.4V, the output current exceeding the programmed maximum allowable DC output current can be clamped down at 1.4V. When the over current condition lasts longer than a predefined time, the switch device 103 will be shut down. During soft start, the current limit reference can be automatically adjusted to a lower level to control the ramp and for safe operation.

Figure 5:
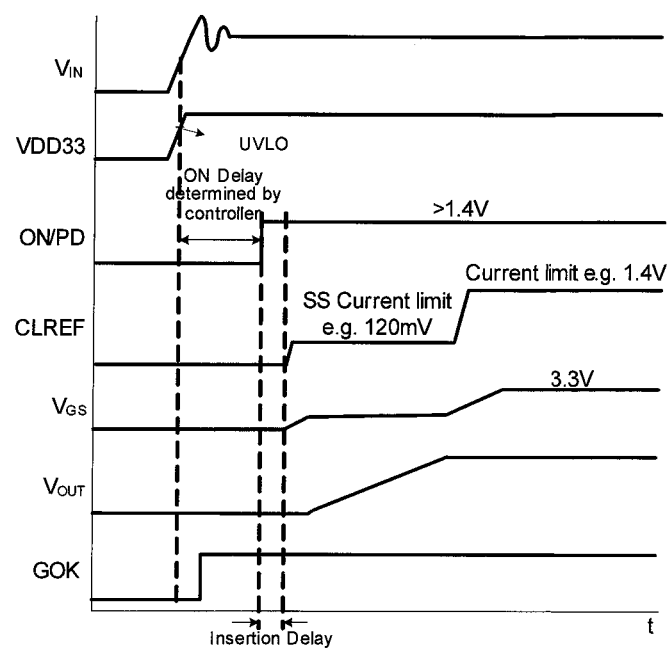
FIG. 5 shows waveforms illustrating startup sequences of a monolithic IC switch device in accordance with an embodiment of the present invention.

FIG. 5 shows waveforms illustrating startup sequences of the switch device 103 in accordance with an embodiment of the present invention. For hot-swap applications, the VIN pin of the switch device 103 can experience a voltage spike or transient during the hot-swap procedure, such as when a circuit card that incorporates the switch device 103 is inserted into a live backplane. The voltage spike or transient is typically caused by parasitic inductance of an input trace and an input capacitor on the VIN pin. When the switch device 103 is configured to work with a microcontroller (e.g., see FIG. 1), the ON/PD pin may be pulled LOW by the microcontroller to turn OFF the power switch 201 for an insertion delay time to stabilize the input power supply voltage $V_{IN}$. The ON/PD pin may be driven HIGH to enable the power switch 201 to turn ON after expiration of the delay time.

As shown in FIG. 5, the input power supply voltage $V_{IN}$ increases at a relatively fast rate. Accordingly, the gate of the switch device 103 can be pulled LOW by the internal control circuitry of 103 during plug-in of an input power supply voltage $V_{IN}$ with high rate of change (i.e., high dv/dt). The switch device 103 internal LDO output at the VDD33 pin ramps up along with the input power supply voltage $V_{IN}$.

When the switch device 103 works in conjunction with a microcontroller, the microcontroller can be powered up by the LDO output at the VDD33 pin or by an external 3.3V power supply. The power switch 201 of the switch device 103 is turned OFF until the enable signal on the ON/PD pin is pulled to HIGH by the microcontroller. When the enable signal becomes HIGH, the power switch 201 is charged up by an internal charge pump. Once the VGS voltage of the power switch 201 reaches its threshold VGSTH, then the output voltage rises.

Figure 6:
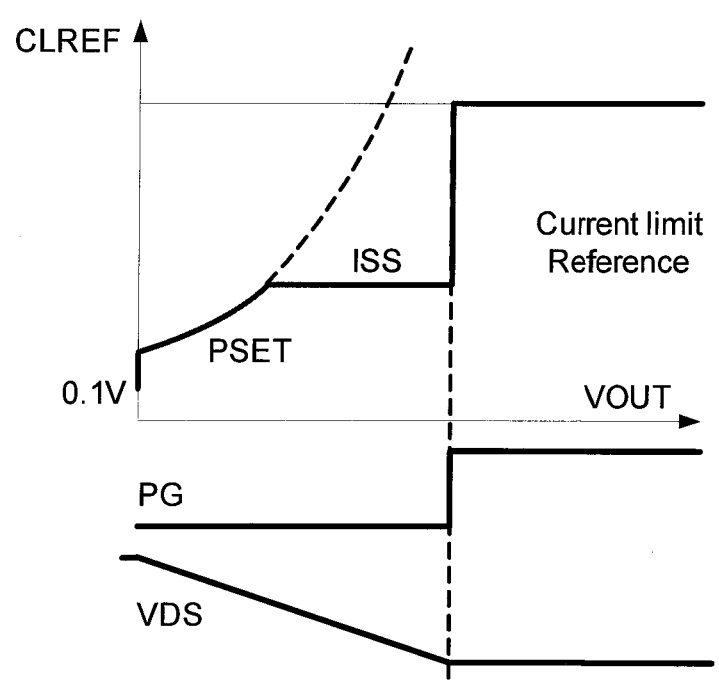
FIGS. 6 and 7 show controlled power up waveforms by power limit and current limit of a monolithic IC switch device in accordance with an embodiment of the present invention.
Figure 7:
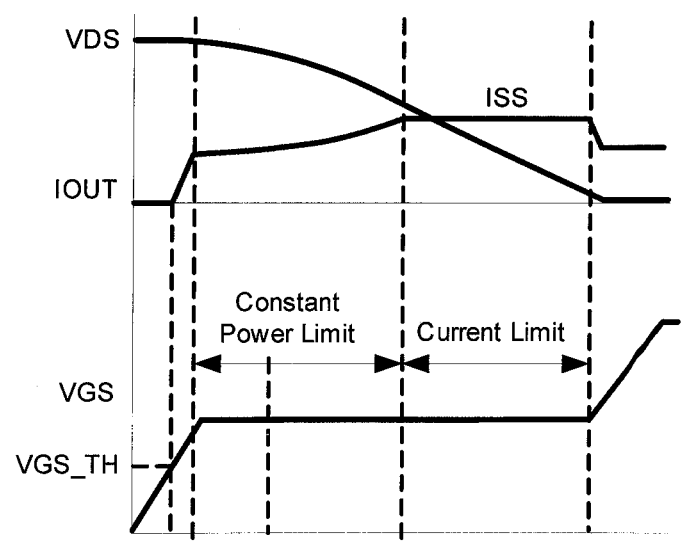

FIGS. 6 and 7 show controlled power up waveforms by power limit and soft start current limit of the switch device 103 in accordance with an embodiment of the present invention. The output current of the switch device 103 can be limited by a current limit reference signal at the CLREF input pin for soft start. In one embodiment, the current sense signal voltage present at the CS pin is compared by the amplifier 205 (see FIG. 2) to the current limit reference signal voltage present at the CLREF pin to regulate the gate of the power switch 201 and prevent the output current from exceeding the current limit defined by the current limit reference signal. The current limit reference signal voltage should be set at a lower level during startup to allow for a controlled gradual ramp up of the output voltage $V_{OUT}$. The current limit reference signal can thereafter be raised to full current limit once the output voltage $V_{OUT}$ has ramped close to the input power supply voltage $V_{IN}$, the gate of the power switch 201 is fully enhanced, and the system is ready to draw power from the input power supply.

To protect the switch device 103 from overheating during startup, a maximum power limit can be included during startup. In one embodiment, the current limit reference signal at the CLREF pin has an internal maximum clamp that depends on Vin−Vout. When Vout<30% Vin, the current limit reference signal is clamped at 200 mV; when 30% VIN<VOUT<80% VIN, the current limit reference signal is clamped at 600 mV; when 80% VIN<Vout, the current limit reference signal is not clamped.

In one embodiment, the ON/PD pin of the switch device 103 can be used to control the turning ON/OFF of the power switch 201 or to select output voltage pull down mode. For example, when the ON/PD pin is used to turn the power switch 201 ON/OFF, the power switch 201 will be turned ON when the enable signal voltage on the ON/PD pin is higher than 1.4V and the power switch 201 will be turned OFF when the enable signal voltage on the ON/PD pin is lower than 1.2V. When the ON/PD pin is used for output voltage $V_{OUT}$ pull down mode control, the voltage at the ON/PD pin can be clamped to around 1V for longer than 200 us, and the switch device 103 can be configured to enter pull down mode when the ON/PD pin voltage is between 0.8V and 1.2V for 200 µs, for example.

Figure 8:
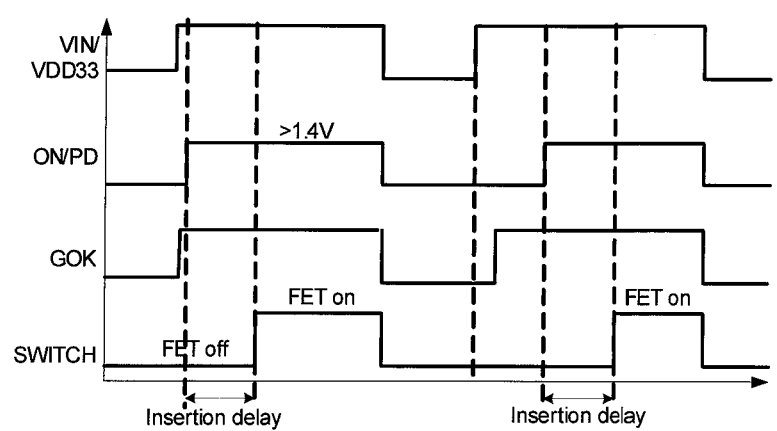
FIG. 8 shows waveforms illustrating power switch ON/OFF control when no fault happens in a monolithic IC switch device in accordance with an embodiment of the present invention.

In one embodiment, the ON/PD control circuit 208 (see FIG. 2) has a fixed 1 ms blanking time after the LDO output voltage and the input power supply voltage $V_{IN}$ becomes higher than the under voltage lockout (UVLO) threshold or after the ON_PD control logic becomes HIGH, whichever occurs last. All fault functionality is operative during the blanking time so that a fault indicator signal at the GOK pin is pulled to HIGH if no fault is detected or is kept LOW if a fault is detected. The HIGH level signal at the ON/PD pin during the blanking time will not turn ON the power switch 201. At the end of the blanking time, the ON/PD pin allows for normal mode to turn ON the power switch 201 if no fault is detected. Once the ON/PD pin is pulled to a level higher than 1.4V and the blanking time ends, an internal current source charges the gate of the power switch 201. Once the gate voltage reaches its threshold $V_{GSTH}$, then the output voltage $V_{OUT}$ rises. The output voltage $V_{OUT}$ rises following the CLREF controlled current limit reference signal and output capacitor. FIG. 8 shows waveforms illustrating power switch ON/OFF control when no fault happens in the switch device 103 in accordance with an embodiment of the present invention.

In one embodiment, the ON/PD pin is pulled HIGH internally with a 5 µA internal pull-up current source. When the switch device 103 works standalone (i.e., without a microcontroller), an external capacitor can be connected from the ON/PD pin to ground. The internal 5 µA current source charges the external capacitor during startup to realize a programmable insertion delay. Once the voltage at the ON/PD pin reaches its turning ON threshold, then the power switch 201 can be turned ON.

Figure 9:
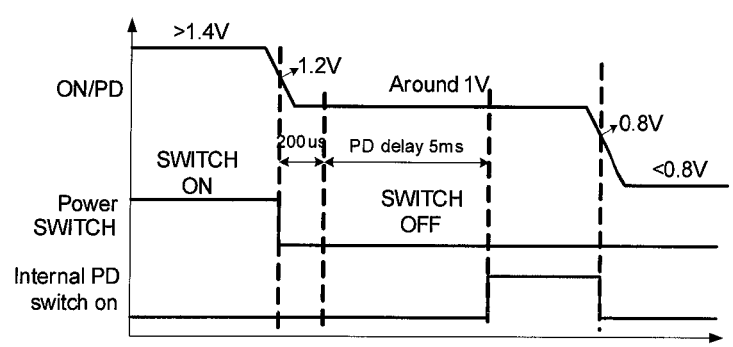
FIG. 9 shows waveforms illustrating pull down mode control of a monolithic IC switch device in accordance with an embodiment of the present invention.

FIG. 9 shows waveforms illustrating pull down mode control of the switch device 103 in accordance with an embodiment of the present invention. In one embodiment, when the voltage on the ON/PD pin is set to around 1V for more than 200 us, the switch device 103 will work in pull down mode. In this mode, when the power switch 201 is turned OFF, an integrated pull down source (resistor or power switch) attached to the output discharges the output after a fixed delay time of 5 ms. If the signal on the ON/PD pin is pulled to LOW directly, pull-down mode is disabled and the output voltage discharges through an external load.

Figure 10:
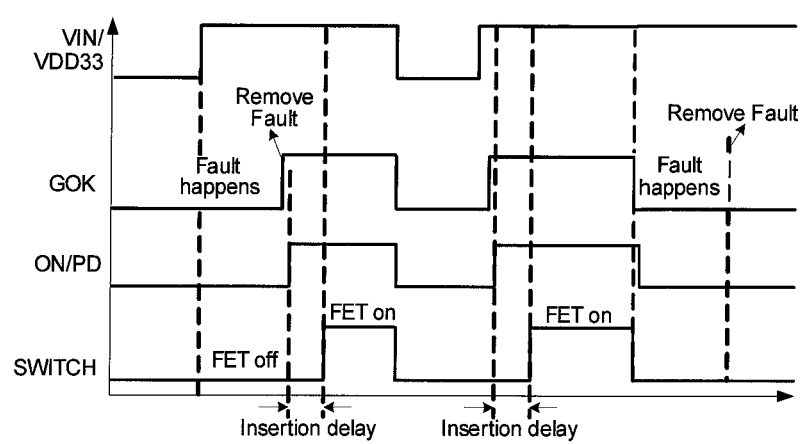
FIG. 10 shows waveforms illustrating power switch ON/OFF control with fault indication from a monolithic IC switch device in accordance with an embodiment of the present invention.

FIG. 10 shows waveforms illustrating power switch ON/OFF control with fault indication from the GOK pin of the switch device 103 in accordance with an embodiment of the present invention. In one embodiment, the fault indicator signal from the GOK pin is an open-drain, active low signal for reporting a fault of the switch device 103. When a fault has occurred, the GOK pin will be pulled low. The GOK pin is pulled up to the LDO output voltage, i.e., the voltage at the VDD33 pin, through a 100 kΩ resistor. The GOK pin output is driven LOW during the LDO output voltage power-up.

Figure 11:
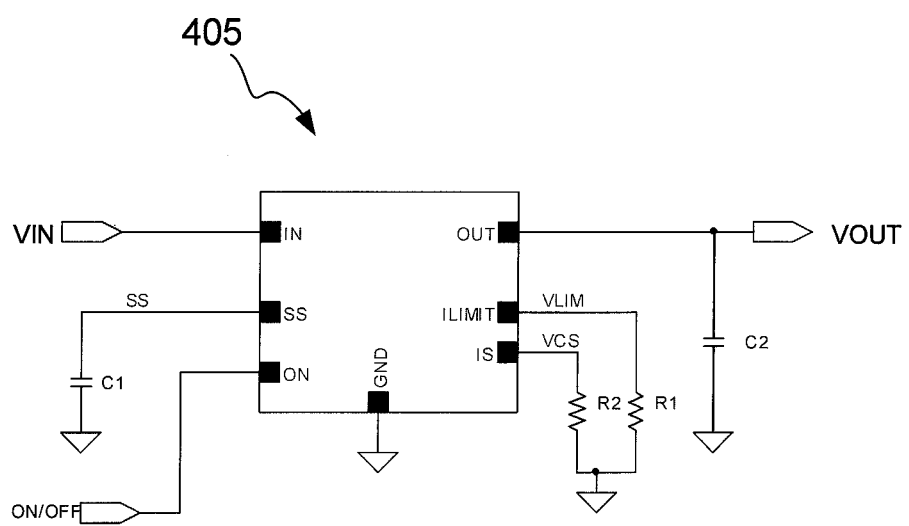
FIG. 11 shows a schematic diagram of a monolithic IC switch device with no current balancing.

Referring now to FIG. 11, there is shown a schematic diagram of a monolithic IC switch device 405 in accordance with an embodiment of the present invention. The switch device 405 is a particular embodiment of the switch device 103 (see FIG. 2). The switch device 405 is a monolithic IC in that it is a single-die chip. In the example of FIG. 11, the switch device 405 has a plurality of pins that includes an IN pin for accepting an input power supply voltage VIN and an OUT pin that outputs an output voltage VOUT to a load, such as another circuit, etc. In the example of FIG. 11, an output capacitor C2 is connected to the OUT pin.

The switch device 405 can include a power switch (see FIG. 12, 421), such as a power FET. The power switch can have a first terminal (e.g., drain) connected to the IN pin and a second terminal (e.g., source) connected to the OUT pin. The switch device 405 includes circuitry that drives the gate of the power switch for turning the power switch ON and OFF in a controlled manner. In the example of FIG. 11, the switch device 405 includes an ON pin for receiving an enable signal for turning the switch device 405 ON or OFF. When the switch device 405 is turned ON, the IN pin is connected to the OUT pin through the power switch. The power switch is OPEN and disconnects the IN pin from the OUT pin when the switch device 405 is turned OFF. An external circuit, such as a microcontroller, may turn the switch device 405 ON or OFF by providing an enable signal to the ON pin of the switch device 405.

In the example of FIG. 11, the switch device 405 further includes an SS pin for receiving a soft start signal, an ILIMIT pin for receiving a current limit reference signal, an IS pin for outputting a current sense signal, and a GND pin for receiving a ground reference.

In the example of FIG. 11, an external resistor R1 is coupled to the ILIMIT pin to configure the current limit of the switch device 405. In one embodiment, the switch device 405 includes an internal current source (e.g., FIG. 12, 423) that outputs a limit current to the ILIMIT pin. The limit current flows to the resistor R1 to develop a current limit voltage VLIM, which sets the current limit of the switch device 405. In one embodiment, the switch device 405 further includes a current sense circuit (e.g., FIG. 12, 424) that outputs a sensed current indicative of the output current flowing from the OUT pin. The sensed current flows out of the IS pin to develop a current sense voltage VCS on an external resistor R2 that is connected to the IS pin. The switch device 405 can compare the current sense voltage VCS to the current limit voltage VLIM to detect overcurrent. In one embodiment, the switch device 405 further includes an internal soft start circuit (e.g., FIG. 12, 426) that outputs a soft start current on the SS pin. In the example of FIG. 11, the soft start current charges an external capacitor C1 to develop a soft start voltage. The switch device 405 can further include additional circuits, such as a thermal sense circuit for detecting the junction temperature of the switch device 405 and other circuits included in a monolithic IC switch device 103 (e.g., see FIG. 2).

In the example of FIG. 11, the soft start voltage, the current limit voltage VLIM, and the current sense voltage VCS are configured by connecting a passive component, such as a resistor or capacitor, to a corresponding pin of the switch device 405. As can be appreciated, the soft start voltage, the current limit voltage VLIM, and/or the current sense voltage VCS may also be provided or monitored by a microcontroller or other external circuit.

Figure 12:
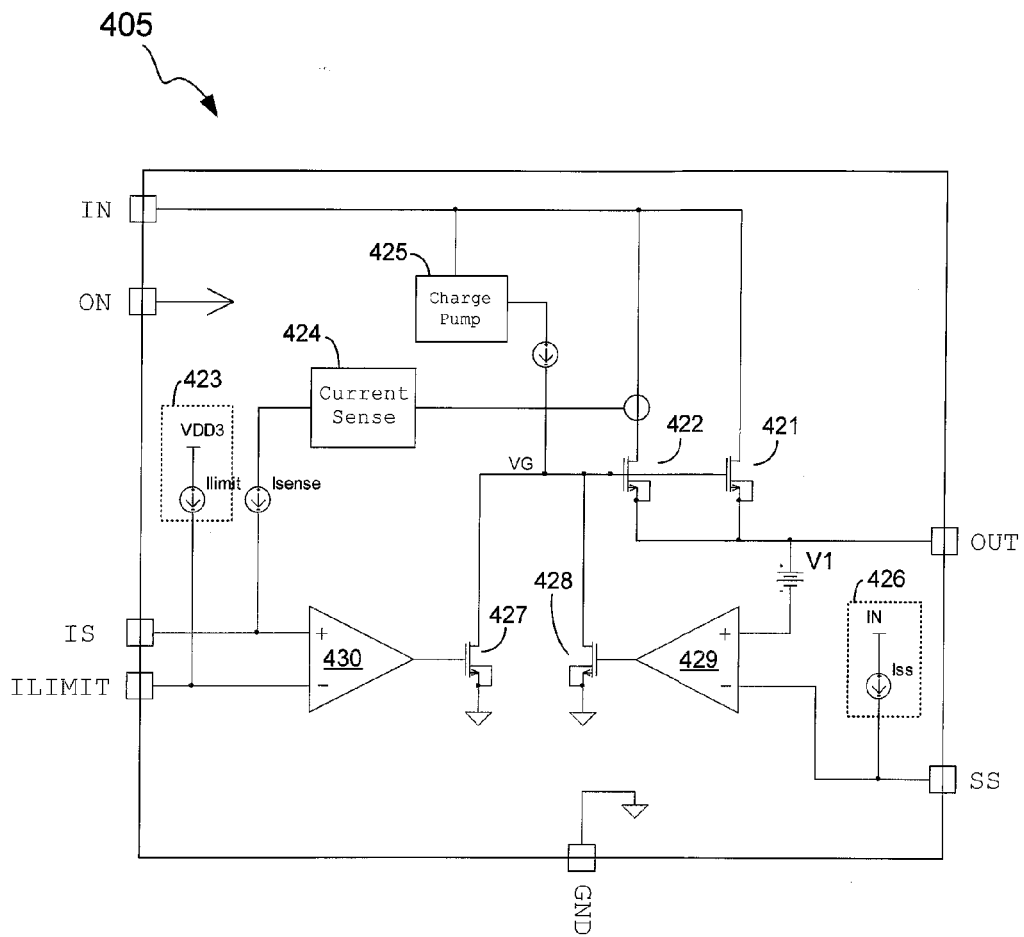
FIG. 12 shows further details of the monolithic IC switch device of FIG. 11.

FIG. 12 shows further details of the monolithic IC switch device 405. In the example of FIG. 12, the switch device 405 includes a power switch 421 in the form of an N-channel FET and a sense transistor 422 in the form of another N-channel FET. When the switch device 405 is turned ON by an enable signal on the ON pin, the power switch 421 is turned ON to connect the IN pin to the OUT pin through the power switch 421. The sense transistor 422 is in parallel with the power switch 421 for current sensing.

A current sense circuit 424 senses the current flowing through the sense transistor 422, which is indicative of the output current of the switch device 405, i.e., the current flowing from the IN pin to the OUT pin. The current sense circuit 424 outputs a sensed current ((sense) that is indicative of the output current and provided to the IS pin. As previously noted with reference to FIG. 11, the sensed current on the IS pin flows to an external resistor to develop a current sense voltage, which is presented to an input of an amplifier 430. An internal current source 423 outputs a limit current ((limit) to the ILIMIT pin. The limit current flows to an external resistor to develop a current limit voltage, which is presented to the other input of the amplifier 430. The amplifier 430 compares the current limit voltage on the ILIMIT pin to the current sense voltage on the IS pin to detect an overcurrent condition, i.e., to detect when the output current flowing from the IN pin to the OUT pin exceeds a specified current limit. When an overcurrent condition occurs, the amplifier 430 turns ON a transistor 427 (e.g., an N-channel FET) to turn OFF the power switch 421, thereby disconnecting the IN pin from the OUT pin. In the example of FIG. 12, a current source 426 generates a soft start current (Iss), which flows to the SS pin. The soft start current charges an external capacitor (e.g., FIG. 11, capacitor C1) to develop a soft start voltage that is presented to an input of a soft start amplifier 429. A voltage V1 is connected between the other input of the soft start amplifier 429 and the OUT pin to disable the soft start amplifier 429 and the transistor 428 after the soft start period.

At startup, i.e., when the switch device 405 is just turned ON from an OFF state, the enable signal on the ON pin is active, and the gate voltage VG on the gate of the power switch 421 is pulled up by a current source in a charge pump circuit 425, thereby allowing the power switch 421 to begin to turn ON and charge an output capacitor (e.g., FIG. 11, output capacitor C2) that is connected to the OUT pin. The output voltage VOUT on the OUT pin ramps up at a rate controlled by the rate of change of the soft start voltage on the SS pin. The soft start amplifier 429 compares the soft start voltage on the SS pin to the output voltage VOUT to regulate the output voltage VOUT to the soft start voltage by controlling the gate voltage VG by way of a transistor 428 (e.g., N-channel FET).

Under some conditions when a plurality of switch devices 405 are connected in parallel, one or more of the switch devices 405 in parallel may fail during startup. More particularly, when the components of the switch devices 405 are not well matched or the offsets of soft start amplifiers 429 vary between switch devices 405, one switch device 405 may draw more current than the other switch devices 405.

This may be the case when there is offset mismatch among the soft start amplifiers 429 of the switch devices 405. This potential problem with parallel-connected switch devices 405 is further explained with reference to FIG. 13.

Figure 13:
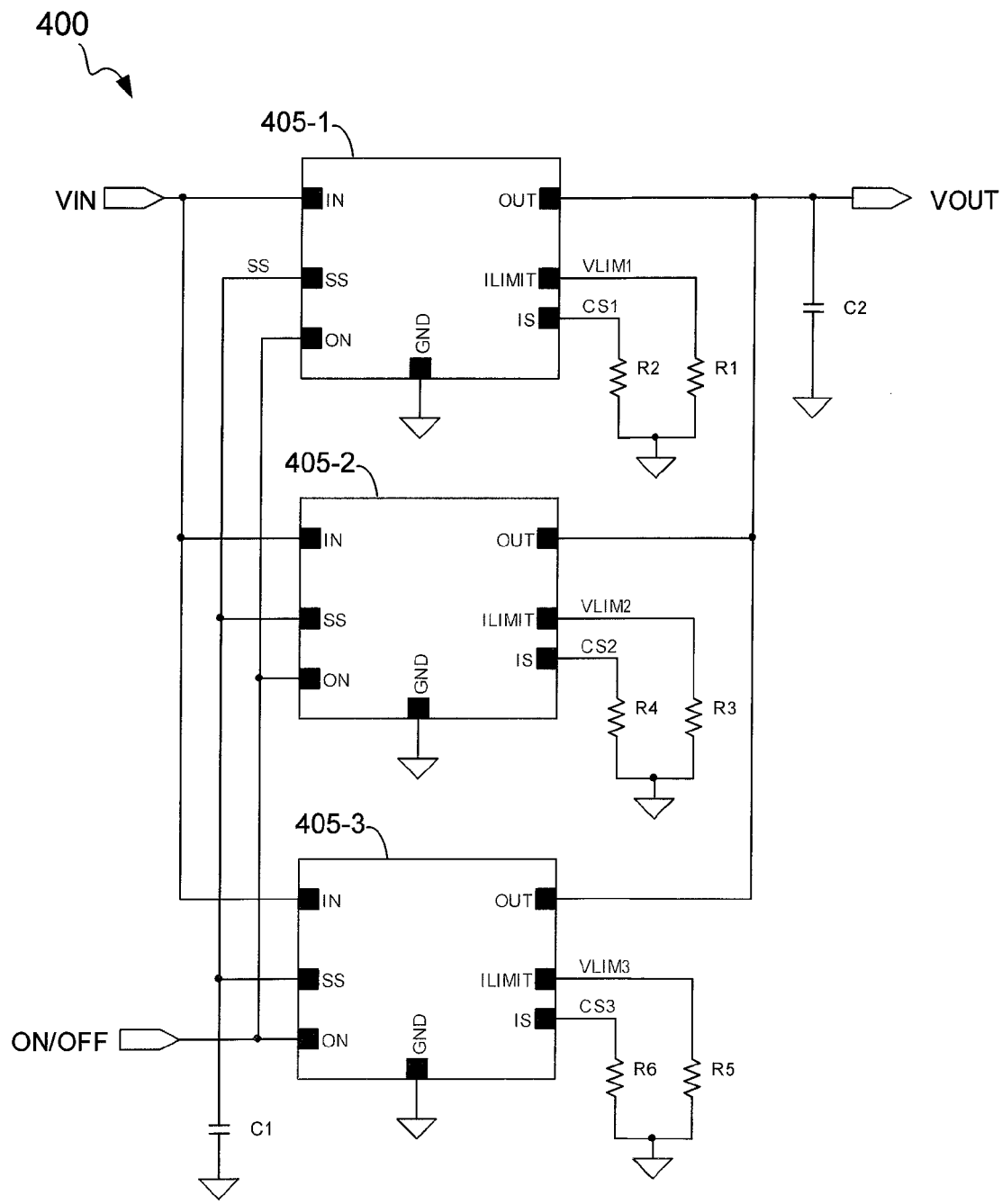
FIG. 13 shows a schematic diagram of an electrical circuit with a plurality of monolithic IC switch devices with no current balancing.

FIG. 13 shows a schematic diagram of an electrical circuit 400 with a plurality of monolithic IC switch devices 405. In the example of FIG. 13, the circuit 400 comprises a plurality of switch devices 405 (i.e., 405-1, 405-2, 405-3) that are connected in parallel. There are three switch devices 405 in parallel in the example of FIG. 13. It is to be noted that the number of switch devices 405 in the electrical circuit 400 may vary depending on the power requirement.

Because the switch devices 405 are in parallel, the IN pins of the switch devices 405 are connected together, and the OUT pins of the switch devices 405 are connected together. The ON pins of the switch devices 405 may also be connected together to turn ON/OFF the switch devices 405 as a single unit. Connecting the switch devices 405 in parallel allow for higher power rating, as the total output current of the electrical circuit 400 is to be divided equally among the switch devices 405. While that is the case at steady state, the total output current may not end up being divided equally among the switch devices 405 at startup when there is component mismatch.

More particularly, referring to FIG. 13, the enable signal at the ON pin of the switch devices 405 is active at startup and the power switches of the switch devices 405 begin to turn ON to charge the output capacitor C2. The soft start amplifier (FIG. 12, 429) of each switch device 405 tries to regulate the output voltage VOUT to the ramping soft start voltage. Ideally, the total output current of the circuit 400 should be divided equally among the three switch devices 405 so that the switch devices 405 do not run into overcurrent or thermal issues. However, because of differences between soft start amplifier 429 offsets, one switch device 405 could draw all of the total output current, leaving none for the other switch devices 405. The switch device 405 that takes all the total output current will get hot and eventually shut down. This results in all of the total output current being drawn by the next switch device 405, which will also get hot and shut down, and so on. The circuit 400 will thus fail at startup in that situation.

Figure 14:
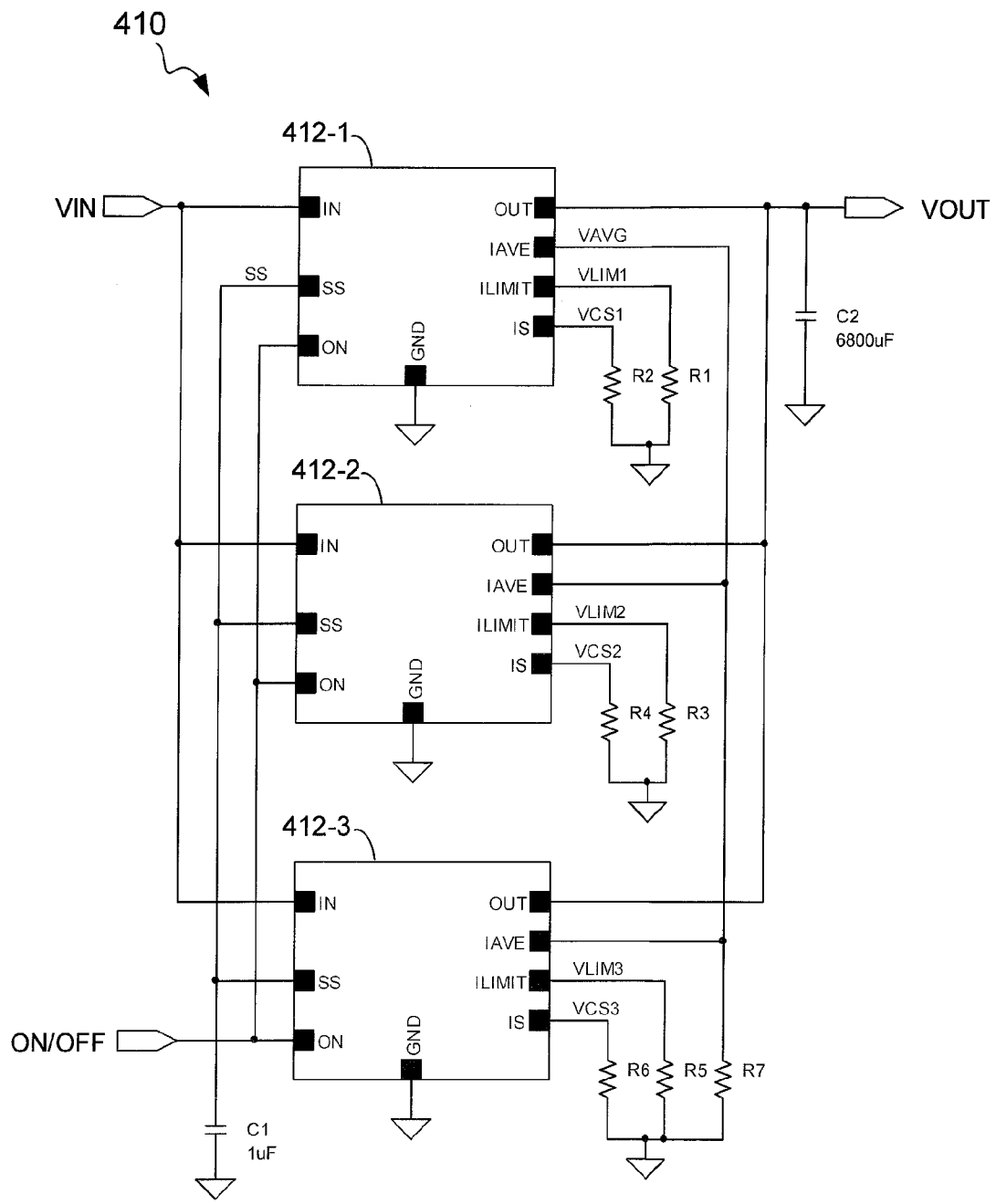
FIG. 14 shows a schematic diagram of an electrical circuit with monolithic IC switch devices with current balancing in accordance with an embodiment of the present invention.

FIG. 14 shows a schematic diagram of an electrical circuit 410 in accordance with an embodiment of the present invention. The electrical circuit 410 is the same as the electrical circuit 400 (see FIG. 13) except for the use of the monolithic IC switch devices 412 (i.e., 412-1, 412-2, 412-3) instead of the monolithic IC switch devices 405. In one embodiment, a switch device 412 is the same as a switch device 405 except for the addition of an IAVE pin and associated internal current balancing circuit (e.g., FIG. 15, 501) for preventing startup failures.

In the example of FIG. 14, the electrical circuit 410 comprises a plurality of monolithic IC switch devices 412 (i.e., 412-1, 412-2, 412-3) that are connected in parallel. There are three switch devices 412 in parallel in the example of FIG. 14. In general, the number of parallel switch devices 412 in the electrical circuit 410 may vary depending on the power requirement.

In the example of FIG. 14, the switch devices 412 are in parallel to operate as a combined switch device. More specifically, for the switch devices 412 in the example of FIG. 14, the ON pins are tied together, the IN pins are tied together, the OUT pins are tied together, and the SS pins are tied together. The switch devices 412 may be turned ON or OFF as a single unit, such as by a single enable signal applied on the ON pins. When the electrical circuit 410 is turned ON, the switch devices 412 are turned ON to connect their IN pins to their OUT pins. Conversely, when the electrical circuit 410 is turned OFF, the switch devices 412 are turned OFF to disconnect their IN pins from their OUT pins.

In the example of FIG. 14, the IAVE pins of the switch devices 412 are tied together to one end of an external balancing resistor R7, and the other end of the balancing resistor R7 is tied to ground. In one embodiment, each switch device 412 has an additional internally-generated sensed current that flows out of its IAVE pin. In the example of FIG. 14, because the IAVE pins of the switch devices 412 are connected together, the sensed currents of the switch devices 412 flow out to the balancing resistor R7, developing an average voltage VAVG that is indicative of the average of the output currents of the switch devices 412. As a particular example, assuming the output current of the switch device 412-1 is 2 A (i.e., 2 Amps), the output current of the switch device 412-2 is 1 A, and the output current of the switch device 412-3 is 3 A, the total output current of the electrical circuit 410 is 6 A (i.e., 2 A+1 A+3 A) and the average of the output currents of the switch devices 412 is 2 A (i.e., 6 A/3). In the example of FIG. 12, the average voltage VAVG is common to all the switch devices 412, providing each switch device 412 a reference for detecting when it is drawing more than the average output current.

In one embodiment, the resistance of the balancing resistor R7 is configured such that the resulting average voltage VAVG is indicative of the average output current, which in one embodiment is equal to the total output current divided by the total number of switch devices in the electrical circuit. For example, with three switch devices 412, the average output current is equal to the total output current of the electrical circuit 410 divided by three. As a particular example, assuming a total output current of 9 A, the average output current in the example of FIG. 14 is equal to 3 A (i.e., 9 A/3). In the example of FIG. 14, the resistance of the balancing resistor R7 may be equal to the resistance of an external resistor R (i.e., R1, R2, R3, R4, R5, or R6) divided by the number of switch devices 412 in parallel. More particularly, $$R7=R/N$$

where R=R2=R3=R4=R5=R6, and N is the number of switch devices 412. As a particular example, with each of the resistors R1, R2, R3, R4, R5, and R6 being a 3KΩ resistor, the balancing resistor R7 may have a resistance of 1KΩ (i.e., 3KΩ/3). As can be appreciated, a balancing resistor may be represented by a single resistor or by a resistor network (e.g., equivalent parallel-connected and/or series-connected resistors).

Figure 15:
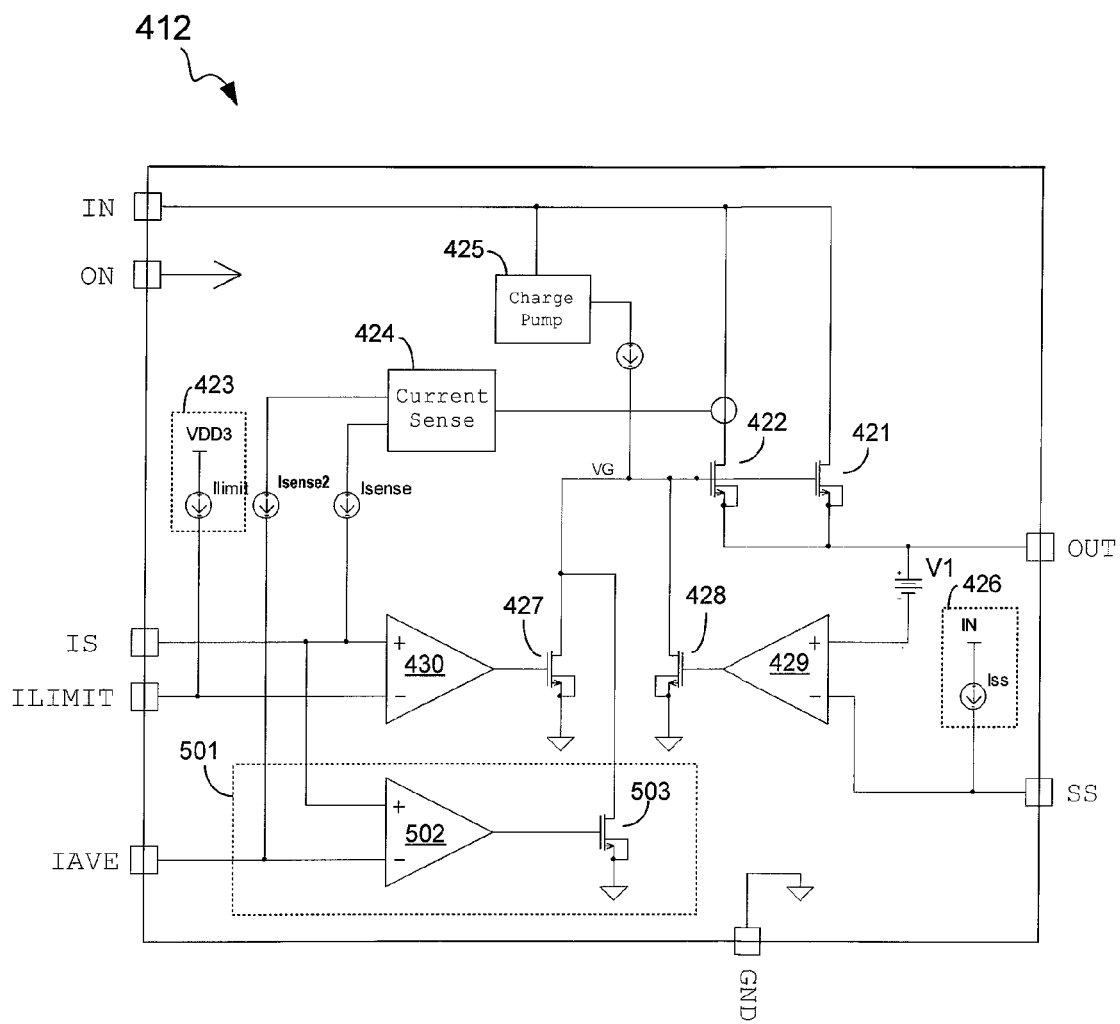
FIG. 15 shows a schematic diagram of a monolithic IC switch device with current balancing in accordance with an embodiment of the present invention.

FIG. 15 shows a schematic diagram of a monolithic IC switch device 412 in accordance with an embodiment of the present invention. The switch device 412 is the same as a monolithic IC switch device 405 (see FIG. 12) except for the addition of a current balancing circuit 501 for balancing the output currents of parallel-connected switch devices 412 during startup. The switch device 412 otherwise has the same components and operates in the same manner as the switch device 405.

In the example of FIG. 15, the current balancing circuit 501 comprises an amplifier 502 and a transistor 503 (e.g., N-channel FET). The current balancing circuit 501 may be active during the soft start period, and disabled thereafter. For example, the current balancing circuit 501 may be disabled when the output voltage VOUT on the OUT pin becomes greater than 90% of an input voltage VIN on the IN pin.

In the example of FIG. 15, the current sense circuit 424 generates a second sensed current (Isense2) that is indicative of the output current, i.e., the current flowing from the IN pin to the OUT pin. In the example of FIG. 1 5, the second sensed current is equal to the other sensed current (i.e., Isense). The second sensed current flows to the IAVE pin and onto the external balancing resistor (e.g., FIG. 14, resistor R7) to develop the average voltage on one input of the amplifier 502. The amplifier 502 compares the average voltage on the IAVE pin (which is indicative of the average of the output currents of the parallel-connected switch devices 412) to the current sense voltage on the IS pin (which is indicative of the output current of the switch device 412). When the output current of the switch device 412 exceeds the average output current, the amplifier 502 controls the transistor 503 to pull down the gate voltage VG of the power switch 421, thereby decreasing the output current of the switch device 412. This prevents the switch device 412 from drawing more current than the average output current. In effect, the current balancing circuit 501 provides a current regulated loop that allows the total output current to be divided equally among all the parallel-connected switch devices 412. This advantageously prevents a parallel-connected switch device 412 from drawing excessive current during startup.

Figure 16:
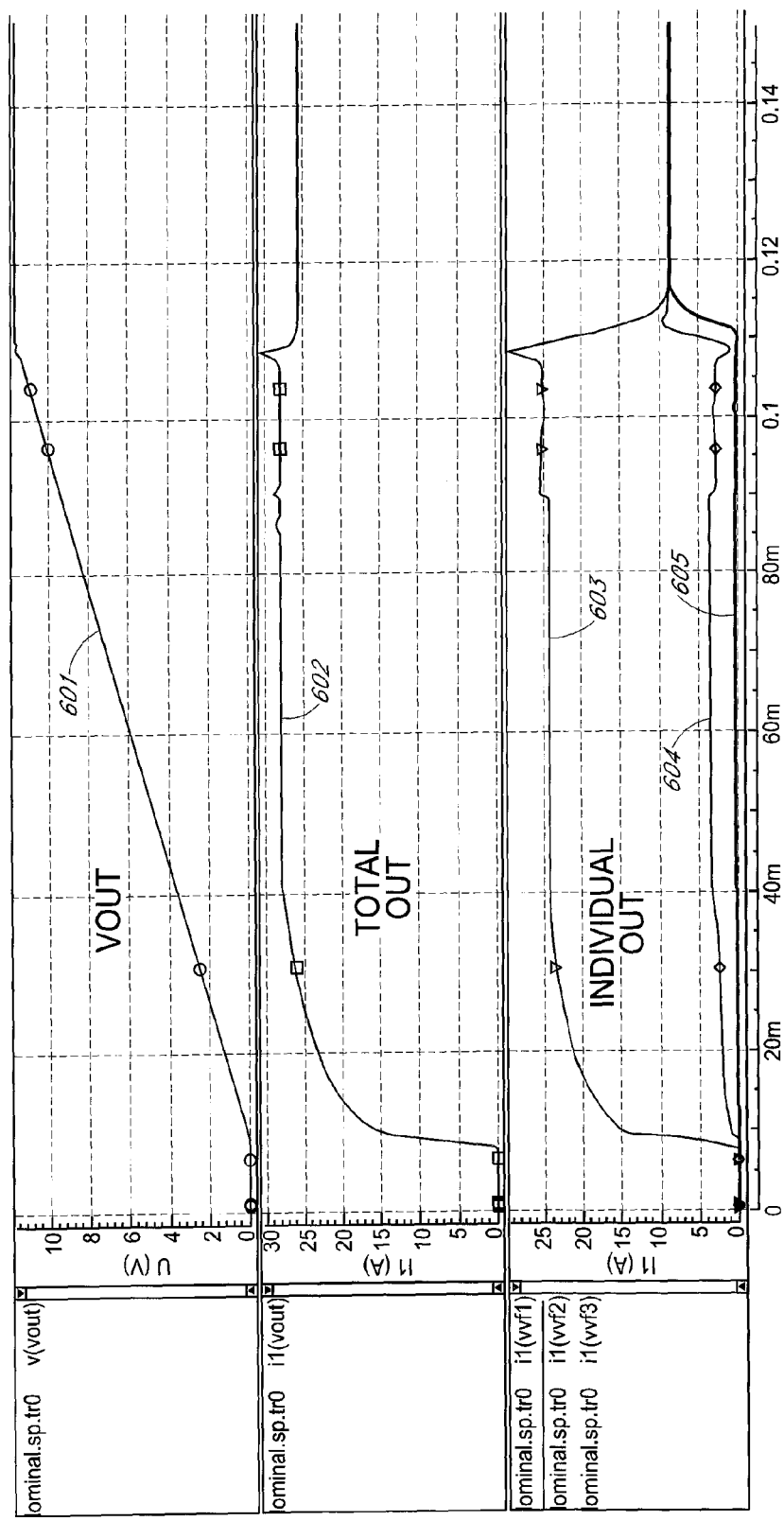
FIGS. 16 and 17 show simulation results of electrical circuits with parallel-connected monolithic IC switch devices.
Figure 17:
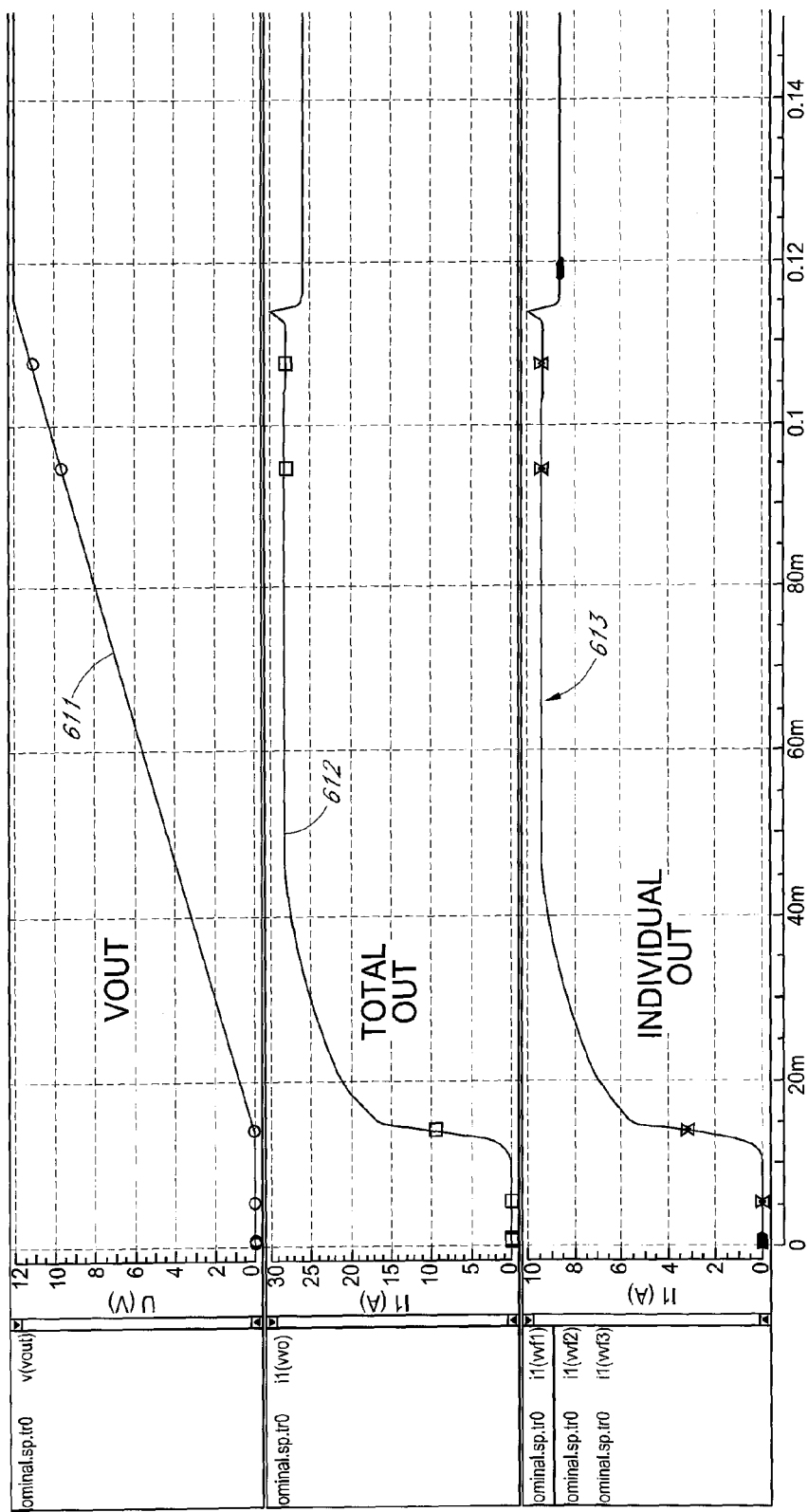

FIGS. 16 and 17 show simulation results of electrical circuits with parallel-connected monolithic IC switch devices. The input voltage VIN on the IN pin is 12V in the simulations of FIGS. 16 and 17.

FIG. 16 shows simulation results for parallel-connected monolithic IC switch devices that have no current balancing, such as switch devices 405 that are connected in parallel (e.g., FIG. 13). FIG. 16 shows simulated waveforms for the output voltage (plot 601) on the OUT pins, the total output current of the electrical circuit (plot 602), and output current of the individual switch devices in parallel (plots 603-605). Note that without current balancing, the output currents are widely different during startup while the output voltage is ramping to a steady state value. More particularly, one of the switch devices (see plot 603) has substantially more output current compared to the other switch devices (see plots 604 and 605).

FIG. 17 shows simulation results for parallel-connected monolithic IC switch devices that have current balancing, such as switch devices 412 that are connected in parallel (e.g., FIG. 14). FIG. 17 shows simulated waveforms for the output voltage (plot 611) on the OUT pins, the total output current of the electrical circuit (plot 612), and output current of the individual switch devices in parallel (see arrow 613). Note that the plots of the output currents of the switch devices are overlapping, because the output currents are essentially the same due to the current balancing.

Figure 18:
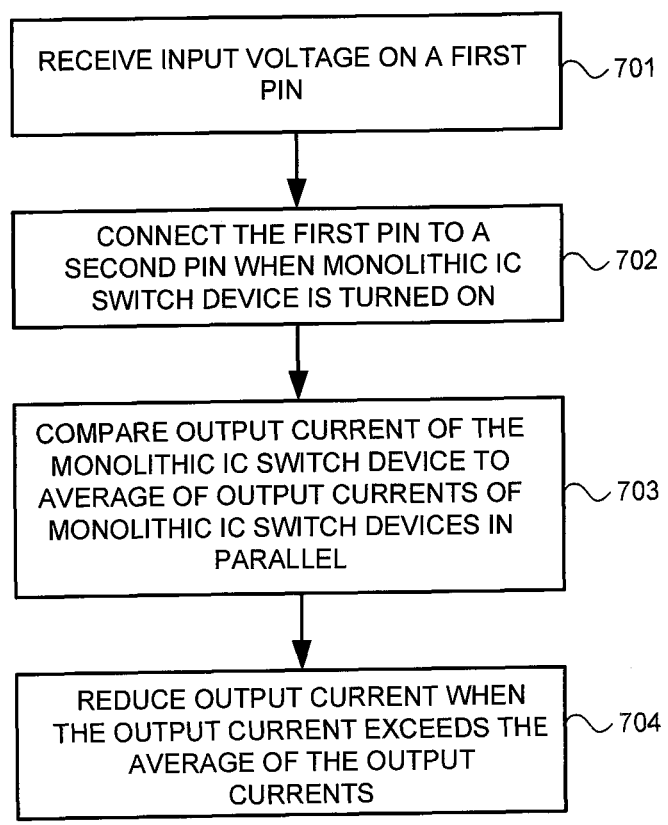
FIG. 18 shows a flow diagram of a method of operating an electrical circuit in accordance with an embodiment of the present invention.

FIG. 18 shows a flow diagram of a method of operating an electrical circuit in accordance with an embodiment of the present invention. The method of FIG. 18 may be performed using a plurality of monolithic IC switch devices 412 connected in parallel. As can be appreciated, other switch devices may also be employed without detracting from the merits of the present invention.

In the example of FIG. 18, a monolithic IC switch device is one of a plurality of monolithic IC switch devices that are connected in parallel. The monolithic IC switch device includes a first pin and a second pin. The monolithic IC switch device receives an input voltage on the first pin (step 701) and connects the first pin to the second pin when the monolithic IC switch device is turned ON (step 702). The plurality of monolithic IC switch devices may be configured to be turned ON as a single unit as part of an electrical circuit. The monolithic IC switch device is turned ON when the electrical circuit is turned ON. The monolithic IC switch device may include a power switch, which connects the first pin to the second pin when the monolithic IC switch device is turned ON. An output current flows from the second pin when the monolithic IC switch device is turned ON.

The monolithic IC switch device compares the output current to an average of output currents of the plurality of monolithic IC switch devices (step 703). During startup, the monolithic IC switch device reduces its output current when its output current exceeds the average of the output currents of the plurality of monolithic IC switch devices (step 704). For example, the monolithic IC switch device may pull down a gate of the power switch when its output current exceeds the average output current of the plurality of monolithic IC switch devices.

Monolithic IC switch devices with current balancing for parallel connection have been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. An electrical circuit comprising:
a first monolithic integrated circuit (IC) switch device comprising a first pin, a second pin, and a power switch that connects the first pin of the first monolithic IC switch device to the second pin of the first monolithic IC switch device through the power switch of the first monolithic IC switch device when the electrical circuit is turned ON; and
a second monolithic IC switch device having a first pin, a second pin, and a power switch that connects the first pin of the second monolithic IC switch device to the second pin of the second monolithic IC switch device through the power switch of the second monolithic IC switch device when the electrical circuit is turned ON, the first pin of the second monolithic IC switch device being connected to the first pin of the first monolithic IC switch device, the second pin of the second monolithic IC switch device being connected to the second pin of the first monolithic IC switch device,
wherein the second monolithic IC switch device further comprises a current balancing circuit that controls the power switch of the second monolithic IC switch device to reduce an output current of the second monolithic IC switch device when the output current of the second monolithic IC switch device is greater than an average of output currents of monolithic IC switch devices in the electrical circuit.

2. The electrical circuit of claim 1, further comprising:
a third monolithic IC switch device having a first pin, a second pin, and a power switch that connects the first pin of the third monolithic IC switch device to the second pin of the third monolithic IC switch device through the power switch of the third monolithic IC switch device when the electrical circuit is turned ON, the first pin of the third monolithic IC switch device being connected to the first pins of the first and second monolithic IC switch devices, and the second pin of the third monolithic IC switch device being connected to the second pins of the first and second monolithic IC switch devices.

3. The electrical circuit of claim 1, wherein the first monolithic IC switch device includes a fourth pin that outputs a signal indicative of an output current of the first monolithic IC switch device, the second monolithic IC switch device includes a fourth pin that outputs a signal indicative of the output current of the second monolithic IC switch device, and the fourth pins of the first monolithic IC switch device and the second monolithic IC switch device are connected together to generate an average voltage that is indicative of the average of the output currents of the monolithic IC switch devices in the electrical circuit.

4. The electrical circuit of claim 3, wherein the second monolithic IC switch device further comprises:
   a fifth pin that outputs a first current sense signal indicative of the output current of the second monolithic IC switch device; and
   a sixth pin that outputs a second current sense signal indicative of the output current of the second monolithic IC switch device.

5. The electrical circuit of claim 4, wherein the current balancing circuit comprises:
   a comparator that compares an average voltage on the fifth pin of the second monolithic IC switch device to a current sense voltage on the sixth pin of the second monolithic IC switch device; and
   a switch controlled by an output of the comparator to control the power switch of the second monolithic IC switch device during startup of the second monolithic IC switch device.

6. The electrical circuit of claim 5, wherein the average voltage on the fifth pin of the second monolithic IC switch device is developed on a balancing resistor by sense currents of the plurality of monolithic IC switch devices.

7. The electrical circuit of claim 1, wherein the power switch comprises a field effect transistor (FET).

8. A monolithic integrated circuit (IC) switch device comprising:
   a first pin that receives an input voltage;
   a second pin connected to a load;
   a power switch that connects the first pin to the second pin when the monolithic IC switch device is turned ON; and
   a current balancing circuit that controls conduction of the power switch during startup of the monolithic IC switch device based on an output current of the monolithic IC switch device relative to output currents of a plurality of monolithic IC switch devices that are connected in parallel together with the monolithic IC switch device.

9. The monolithic IC switch device of claim 8, wherein the current balancing circuit controls the conduction of the power switch based on a comparison of the output current of the monolithic IC switch device with an average of the output currents of the plurality of monolithic IC switch devices.

10. The monolithic IC switch device of claim 9, wherein the current balancing circuit comprises:
   a comparator that receives a current sense signal indicative of the output current of the monolithic IC switch device from a third pin of the monolithic IC switch device, receives an average signal indicative of the average of the output currents of the plurality of monolithic IC switch devices from a fourth pin of the monolithic IC switch device, and outputs a comparison signal based on a comparison of the current sense signal with the average signal.

11. The monolithic IC switch device of claim 9, wherein the current balancing circuit further comprises:
   a switch that controls a gate of the power switch based on the comparison signal.

12. The monolithic IC switch device of claim 11, wherein the switch pulls down the gate of the power switch when the output current of the monolithic IC switch device exceeds the average of the output currents of the plurality of monolithic IC switch devices.

13. The monolithic IC switch device of claim 10, wherein the current sense signal is a current sense voltage developed from a first sense current that is output by the monolithic IC switch device on the third pin.

14. The monolithic IC switch device of claim 10, wherein the average signal is an average voltage developed on a balancing resistor by sense currents of the plurality of monolithic IC switch devices.

15. The monolithic IC switch device of claim 8, wherein the current balancing circuit reduces the output current of the monolithic IC switch device when the output current of the monolithic IC switch device is greater than an average of the output currents of the plurality of monolithic IC switch devices.

16. A method comprising:
   receiving an input voltage on a first pin of a monolithic integrated circuit (IC) switch device;
   connecting the input voltage to a second pin of the monolithic IC switch device through a power switch in response to the monolithic IC switch device being turned ON from an OFF state;
   comparing an output current of the monolithic IC switch device with an average output current of a plurality of monolithic IC switch devices that include the monolithic IC switch device and that are connected in parallel; and
   reducing the output current of the monolithic IC switch device when the output current of the monolithic IC switch device is greater than the average output currents of the plurality of monolithic IC switch devices.

17. The method of claim 16, wherein reducing the output current of the monolithic IC switch device comprises:
   pulling down a gate of the power switch when the output current of the monolithic IC switch device is greater than the average output currents of the plurality of monolithic IC switch devices.

18. The method of claim 16, further comprising:
   outputting on a third pin of the monolithic IC switch device a first sense current indicative of the output current of the monolithic IC switch device; and
   outputting on a fourth pin of the monolithic IC switch device a second sense current indicative of the output current of the monolithic IC switch device.

19. The method of claim 18, further comprising:
   presenting on the third pin a current sense voltage that is indicative of the output current of the monolithic IC switch device;
   presenting on the fourth pin an average voltage indicative of the average of the output currents of the plurality of monolithic IC switch devices; and
   comparing the sense voltage to the average voltage.

20. The method of claim 19, further comprising:
   using the first sense current to develop the current sense voltage on a sense resistor connected to the third pin; and
   using the second sense current to develop the average voltage on a balancing resistor connected to the fourth pin.

* * * * *